United States Patent
Li et al.

(10) Patent No.: US 10,746,590 B2
(45) Date of Patent: Aug. 18, 2020

(54) METHOD AND APPARATUS FOR ONLINE CONDITION MONITORING OF VARIABLE SPEED MOTOR APPLICATIONS

(71) Applicant: Rockwell Automation Technologies, Inc., Mayfield Heights, OH (US)

(72) Inventors: Linglai Li, Shanghai (CN); Zhenhuan Yuan, Shanghai (CN); Kun Wei, Shanghai (CN); Robert H. Schmidt, Germantown, WI (US); Michael J. Melfi, Richfield, OH (US); Brian Fast, Kirtland, OH (US); Sunil R. Gaddam, Carver, MN (US); Chris E. Gottlieb, Edina, MN (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 315 days.

(21) Appl. No.: 15/719,897

(22) Filed: Sep. 29, 2017

(65) Prior Publication Data

US 2019/0101436 A1     Apr. 4, 2019

(51) Int. Cl.
*G01H 1/00*     (2006.01)
*H02H 7/08*     (2006.01)
(Continued)

(52) U.S. Cl.
CPC .......... *G01H 1/006* (2013.01); *G01R 31/343* (2013.01); *H02H 7/08* (2013.01); *H02K 11/21* (2016.01);
(Continued)

(58) Field of Classification Search
CPC .... G01H 1/006; H02K 11/21; H02P 29/0241; H02P 29/032; G01R 31/343; H02H 7/08
See application file for complete search history.

(56) References Cited

U.S. PATENT DOCUMENTS

| 4,761,703 A | 8/1988 | Kliman et al. |
| 2012/0001580 A1 | 1/2012 | Zhang et al. |

(Continued)

FOREIGN PATENT DOCUMENTS

| EP | 1298511 A1 | 4/2003 |
| EP | 2581725 A2 | 4/2013 |
| EP | 2743670 A1 | 6/2014 |

OTHER PUBLICATIONS

Extended European Search Report dated Feb. 22, 2019; Application No. 18197150.8—(9) pages.

(Continued)

*Primary Examiner* — Bryan Bui
(74) *Attorney, Agent, or Firm* — Boyle Fredrickson, SC (57) ABSTRACT

The subject matter disclosed herein describes a method and system to monitor and identify vibrations in a rotational mechanical system. Various fault conditions in a rotating machine operating at variable speeds may be identified, at least in part, by identifying the multiple of the fundamental frequency, or order, at which the vibration occurs. The orders of vibration present in a measured vibration signal may be determined by finding an order spectrum of a measured vibration signal in the position domain. A fault vector is generated from the order spectrum that identifies the magnitude of each order of vibration present in the measured vibration signal. The fault vector may be plotted on a radar chart to provide a visual indication of the type of fault present in the mechanical system. Evaluation models for each fault determines a probability and magnitude for each fault condition being present in the sampled vibration signal.

20 Claims, 4 Drawing Sheets

(51) Int. Cl.
G01R 31/34 (2020.01)
H02P 29/032 (2016.01)
H02P 29/024 (2016.01)
H02K 11/21 (2016.01)

(52) U.S. Cl.
CPC ........ *H02P 29/0241* (2016.02); *H02P 29/032* (2016.02)

(56) References Cited

U.S. PATENT DOCUMENTS

| | | | | |
|---|---|---|---|---|
| 2012/0126738 | A1* | 5/2012 | Li | H02P 29/0241 318/490 |
| 2017/0002635 | A1* | 1/2017 | Williams | E21B 43/127 |
| 2018/0292255 | A1* | 10/2018 | Miklosovic | H02P 6/10 |

OTHER PUBLICATIONS

Head Acoustics—Application Note—Aug. 2016, "Order analysis in ArtemiS Suite"—(12) pages.

P. Borghesani et al., Mechanical Systems and Signal Processing 44 (2014) 118-133, "VSDFT velocity synchronous discrete Fourier transform for order tracking"—(16) pages.

* cited by examiner

METHOD AND APPARATUS FOR ONLINE CONDITION MONITORING OF VARIABLE SPEED MOTOR APPLICATIONS

BACKGROUND INFORMATION

The subject matter disclosed herein relates generally to a method and system for online diagnostic evaluation of a motor driven mechanical system and, more specifically, to a method and system for monitoring a frequency spectrum obtained from a measured or commanded signal corresponding to operation of a motor in the mechanical system to identify a probability and severity of one of several fault conditions present in the motor.

Electrical rotating machines, such as electric motors or generators, have become widespread and are found in numerous applications and configurations. Electric machines include a stationary component (i.e., the stator) and a rotating component (i.e., the rotor). In electric motors, a magnetic field is established in the rotor, for example via magnets mounted to the rotor or via an electrical current applied to or induced in a coil wound on the rotor. A second, rotating magnetic field is established as a result of the application of a controlled voltage to the stator, and the rotation of the magnetic field in the stator causes the magnetic field in the rotor to rotate, thereby causing rotation of the rotor. A shaft or other drive member is mounted to the rotor and extends outside the rotor housing providing a mechanical coupling to a device, such as a gearbox, pump, or fan that is to be driven as the rotor rotates.

As is known to those skilled in the art, motor drives are utilized to control operation of a motor. Motor drives may be provided to convert input power, from either an alternating current (AC) source or a direct current (DC) source, to the controlled voltage applied to the stator. In certain applications, high performance of the motor and the controlled machine is desired. For example, a servo motor may position a machine tool with high speed and tight position tolerances for repeatable manufacturing of components. The servo motors may be mounted to a machine and coupled, via a gearbox to a drive member, such as a ball-screw or a rack and pinion used to position one axis of the machine.

Due to the rotational nature of an electric machine, fault conditions may present themselves as vibrations or resonances within the mechanical system. The fault conditions may be a result of normal wear, such as bearing wear, or due to application specific conditions, such as a misalignment between the motor shaft and the gearbox, a compliant mechanical load, or torque ripple resulting from the motor construction. These conditions may generate an imbalance on the rotor shaft and can result in vibrations or resonance being generated within the control system. Vibration in a rotational mechanical system may accelerate wear and increase maintenance frequency and expense.

Thus, it would be desirable to provide a method and system to monitor and identify vibrations in a rotational mechanical system to provide an early indication of a problem in the system and to extend machine life.

Historically, vibration detection has been performed external to the motor drive, for example, by data acquisition and analysis systems. A vibration sensor may be mounted to the motor and a signal corresponding to vibration is generated and transmitted to the data acquisition and analysis system. Vibration sensors, however, introduce additional expense and configuration requirements. A vibration sensor requires additional clearance for installation and must be aligned such that the transducers within the sensor detect vibration in a desired direction, such as axially or radially with respect to the motor.

As an alternative to a vibration sensor, the motor drive may be configured to transmit data to the data acquisition and analysis system, where the data corresponds to operation of the motor or motor drive. When vibration occurs, the current feedback signal, for example, may include harmonic content at the frequency of vibration. By transmitting such data to the data acquisition and analysis system, the system may analyze the content of the signal and provide a frequency response of the signal which identifies the harmonic content. However, complex control systems, such as a machine tool or a process line include multiple controlled motors or axes of motion. As the number of controlled axes increase, the volume of data being transmitted over a data bus to the data acquisition and analysis system by multiple motor drives similarly increases. In order to detect vibration at a particular frequency, the data must be sampled at a rate at least twice that of the frequency to be detected and preferably the data is sampled at a rate that is an order of magnitude greater than the frequency to be detected. To detect a vibration, for example, at 500 Hz, the data must be sampled at a minimum of one thousand times per second and preferably at five thousand times per second. Each sample for each motor drive must then be transmitted to the data acquisition and analysis system using a significant amount of communications bandwidth both within the motor drive and on an industrial network provided between the data acquisition system and the motor drives.

Thus, it would be desirable to provide an improved method and system for analyzing motor performance to detect vibration of an electric machine controlled by a motor drive.

As indicated above, a number of different conditions, such as bearing wear, misalignment, or a bent shaft, may cause vibration in the machine. However, many of the different conditions that cause vibrations exhibit different vibration characteristics.

For example, the vibration may vary with load or vary as a function of the speed of the motor. The different conditions may generate a vibration that has a frequency equal to or proportional to the speed of the motor or that has a frequency that is equal to or proportional to multiples of the speed of the motor.

Thus, in addition to detecting vibration, it would be desirable to provide an improved method and system for identifying various fault conditions in a rotating machine operating at variable speeds in a mechanical system as a function of the characteristics of the detected vibration.

BRIEF DESCRIPTION

The subject matter disclosed herein describes a method and system to monitor and identify vibrations in a rotational mechanical system. Various fault conditions in a rotating machine operating at variable speeds in the mechanical system may be determined as a function of the monitored vibrations. Many vibrations in a rotational system cause a periodic vibration within the system at multiples of the fundamental frequency of rotation of the motor. Thus, specific vibrations may be identified, at least in part, by identifying the multiple of the fundamental frequency at which the vibration occurs. Each multiple is also referred to as an "order". In other words, a vibration occurring at the same frequency at which the motor is rotating is a first order vibration, a vibration occurring at twice the frequency at which the motor is rotating is a second order vibration, and so on.

The orders of vibration present in a measured vibration signal may be determined by finding an order spectrum of the measured vibration signal. A vibration signal and a velocity signal are sampled in tandem at a fixed time interval such that the sampled signals are in a time domain. The velocity signal is used to transform the sampled vibration signal from the time domain to a position domain. The position domain signal includes the order spectrum of the measured vibration signal. As a result, the position domain signal may be used to generate a fault vector that identifies the magnitude of each order of vibration of interest that is present in the measured vibration signal. The fault vector may be plotted on a radar chart to provide a visual representation of the orders of vibration present in the fault vector, and the shape of the fault vector provides a visual indication to a user of the type of fault present in the mechanical system. Additionally, an evaluation model is developed for each fault to be detected that further determines a probability and magnitude for each fault condition being present in the sampled vibration signal.

A method for monitoring an operating condition of a motor with a motor drive operatively connected to control operation of the motor is disclosed. In one embodiment of the invention, a first feedback signal is periodically sampled at a sampling frequency, where the first feedback signal includes data corresponding to the operating condition of the motor. A velocity feedback signal is periodically sampled at the sampling frequency, where the velocity feedback signal corresponds to an angular velocity of the motor. A fault vector for the first feedback signal is generated as a function of the first feedback signal and of the velocity feedback signal, where the fault vector includes a magnitude of harmonic content present in the first feedback signal at each of a plurality of multiples of the angular velocity of the motor. A feature vector is generated from the fault vector, where the feature vector includes a plurality of values identifying how close the fault vector corresponds to an ideal fault vector, and a fault condition present in the motor is identified as a function of the feature vector.

According to another embodiment of the invention, a system for monitoring an operating condition of a motor includes a position sensor operatively connected to the motor and a motor drive operatively connected to the motor to control operation of the motor. The position sensor generates a position feedback signal corresponding to an angular position of the motor, and the motor drive includes a feedback circuit operatively connected to the position sensor to receive the position feedback signal. The motor drive also includes a processor operative to periodically sample the position feedback signal and to generate a velocity feedback signal corresponding to an angular velocity of the motor as a function of the position feedback signal. The processor periodically samples a monitored feedback signal and generates a fault vector for the monitored feedback signal as a function of the monitored feedback signal and of the velocity feedback signal. The monitored feedback signal includes data corresponding to the operating condition of the motor, and the fault vector includes a magnitude of harmonic content present in the monitored feedback signal for at least one multiple of the angular velocity of the motor. A fault condition present in the motor is identified as a function of the feature vector, and the processor is operative to perform each of the steps in real time while the motor drive is controlling operation of the motor.

According to yet another embodiment of the invention, a method for monitoring an operating condition of a motor with a motor drive operatively connected to control operation of the motor is disclosed. A first feedback signal and a velocity feedback signal are sampled at a sampling frequency. The first feedback signal includes data corresponding to the operating condition of the motor, and the velocity feedback signal corresponds to an angular velocity of the motor. A fault vector is generated for the first feedback signal as a function of the first feedback signal and of the velocity feedback signal. The fault vector includes a magnitude of harmonic content present in the first feedback signal for at least one multiple of the angular velocity of the motor, and the fault vector is generated in real-time as the motor drive is controlling operation of the motor. A fault condition is identified as present in the motor as a function of the fault vector.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Figure 1:
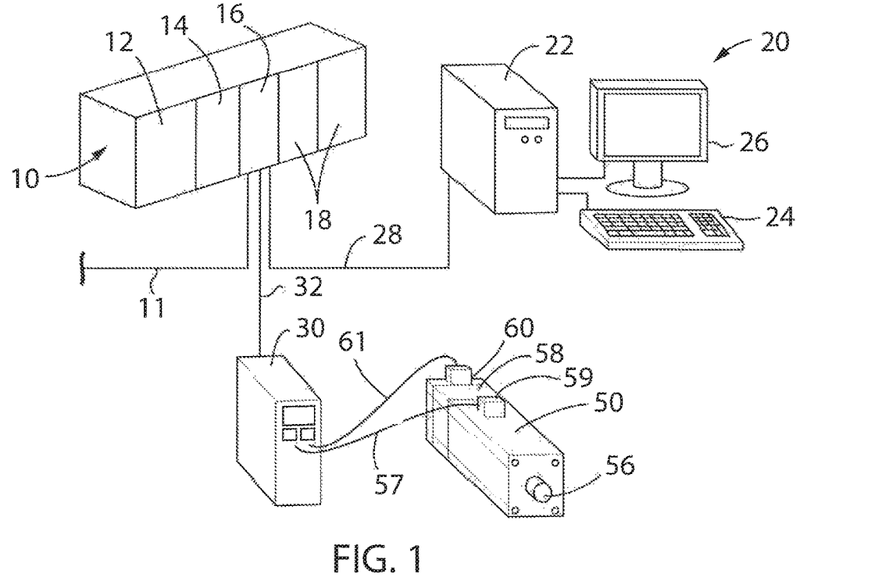
FIG. 1 is a perspective view of an exemplary industrial control application incorporating the present invention.

Turning initially to FIG. 1, an exemplary industrial control network includes an industrial controller 10 in communication with a motor drive 30 and a remote processing device 20. As illustrated, the industrial controller 10 is modular and may be made up of numerous different modules connected together in a rack or mounted to a rail. Additional modules may be added or existing modules removed and the industrial controller 10 reconfigured to accommodate the new configuration. Optionally, the industrial controller 10 may have a predetermined and fixed configuration. In the illustrated embodiment, the industrial controller 10 includes a power supply module 12, a processor module 14, a network module 16, and two additional modules 18 that may be selected according to the application requirements and may be, for example, analog or digital input or output modules.

One or more remote processing devices 20 may be connected to the industrial control network. The remote processing device may be an operator interface located proximate to the industrial controller, a desktop computer located at a separate facility from the industrial controller, or a combination thereof. The remote processing device 20 may include a processing unit 22, input device 24, including, but not limited to, a keyboard, touchpad, mouse, trackball, or touch screen, and a display device 26. It is contemplated that each component of the remote processing device may be incorporated into a single unit, such as an industrial computer, laptop, or tablet computer. It is further contemplated that multiple display devices 26 and/or multiple input devices 24 may be distributed about the controlled machine or process and connected to one or more processing units 22. The remote processing device 20 may be used to display operating parameters and/or conditions of the controlled machine or process, receive commands from the operator, or change and/or load a control program or configuration parameters. An interface cable 28 connects the remote processing device 20 to the industrial controller 10.

The industrial controller 10 is connected to other devices by one or more networks according to the application requirements. As illustrated, interface cables 28, 32 connect the industrial controller 10 to the remote processing device 20 and the motor drive 30, respectively. It is contemplated that the interfaces cables 28, 32 may be a custom cable configured to communicate via a proprietary interface or may be any standard industrial network cable, including, but not limited to, Ethernet/IP, DeviceNet, or ControlNet. The network module 16 is configured to communicate according to the protocol of the network to which it is connected and may be further configured to translate messages between two different network protocols. An additional network cable 11 may be a standard Ethernet cable connected to a network external from the industrial network, such as the Internet or an intranet.

The industrial control network further includes a motor drive 30 and a motor 50. The motor drive 30 is connected to the industrial controller 10 via a network cable 32. As illustrated, the motor drive 30 is connected to a network module 16 to receive communications from the industrial controller 10. The communications may include configuration packets or operating commands generated by the processing module 14. Optionally, the industrial controller 10 may include another module (not shown) dedicated to communicating with the motor drive 30. The additional module may be, for example, a servo module, which is configured to generate motion profiles, velocity profiles, or other command profiles and transmit the commands to the motor drive 30.

The motor drive 30 receives the commands, which indicate a desired operation of the motor 50, and generate a variable frequency and variable amplitude voltage for the motor to achieve the desired operation. A power cable 57 extends between the motor drive 30 and a junction box 59 on the motor to supply the variable frequency and variable amplitude voltage to the motor. A feedback cable 61 extends between an encoder 60 mounted to the rear of the motor 50 and the motor drive 30. The encoder 60 generates a position feedback signal corresponding to an angular position of the motor 50. The position feedback signal may be provided directly to the motor drive via the feedback cable or some initial processing, such as inserting the position information into a data packet for serial communications or converting the position signal to a velocity signal, may be performed within the encoder 60 prior to sending the feedback signal to the motor drive 30. The illustrated embodiment further includes a brake module 58 mounted between the motor 50 and the encoder 60. A control signal is provided from an output 44 (see FIG. 2) of the motor drive 30 to release the brake and a feedback signal may be provided from the brake 58 to the motor drive 30 to indicate the brake is opened. It is further contemplated that other sensors and/or actuators may be mounted to or within an extension of the housing for the motor 50 according to application requirements. For example, sensors such as a vibration sensor or a temperature sensor may be mounted at various locations within, on, or proximate to the housing of the motor 50 to monitor operating performance. Each of the sensors generates a signal that may be transmitted directly to the motor drive 30 or to an additional control module embedded within the housing of the motor 50. The additional control module may include, for example, logic circuits such as analog to digital converters, buffers, communication ports, processors and the like to receive the signals from each sensor and to convert the signals to another format and/or to generate data packets in which data is inserted for transmission to the motor drive 30. Additional conductors and/or cables may be connected between the motor drive 30 and the motor 50 according to the application requirements to transfer each of the control and/or feedback signals between the motor drive 30 and the motor 50.

Figure 2:
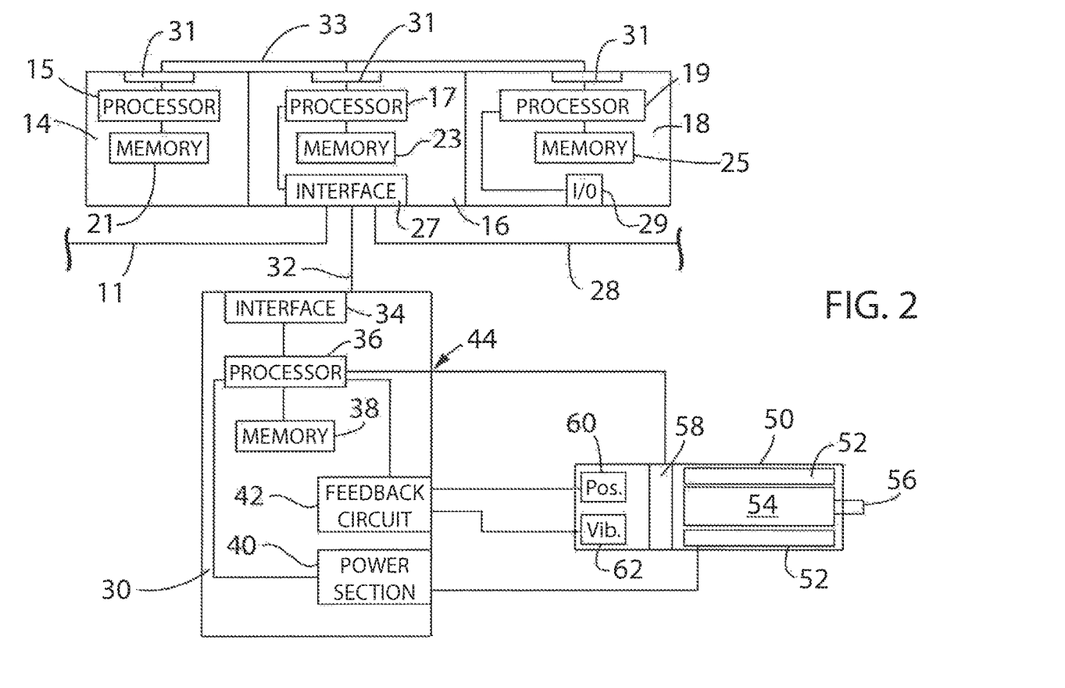
FIG. 2 is a partial block diagram representation of the exemplary industrial control application of FIG. 1.

Referring next to FIG. 2, a portion of the exemplary industrial control network shown in FIG. 1 is illustrated in block diagram form. Each of the modules 14, 16, 18 in the industrial controller 10 may include a processing device and memory. The functionality and size of the processing device and memory may vary according to the requirements of each module. As illustrated, each module 14, 16, 18 includes a processor 15, 17, 19 configured to execute instructions and to access or store operating data and/or configuration parameters stored in the corresponding memory device 21, 23, 25. The processors 15, 17, 19 may be any suitable processor according to the module requirements. It is contemplated that processors 15, 17, 19 may include a single processing device or multiple processing devices executing in parallel and may be implemented in separate electronic devices or incorporated on a single electronic device, such as a microprocessor, a field programmable gate array (FPGA) or application specific integrated circuit (ASIC). Similarly, the memory devices 21, 23, 25 may be a single device, multiple devices or may be incorporated in part or in whole within the FPGA or ASIC.

The modules may further include additional logic and/or control circuits according to the module requirements. Each I/O module 18, for example, includes input and/or output terminals and the associated circuitry 29 to connect the I/O module to an external device. The network module 16 includes a network interface 27 configured to receive data packets from the network media connected to the interface. According to the illustrated embodiment, the network interface 27 is connected to an external network via Ethernet cable 11 as well as the motor drive 30 and remote processing device 20 via the respective network cables 32, 28. The network module 16 may be configured to function as a gateway between networks and to convert data packets between protocols.

The motor drive 30 also includes a processing device and memory. As illustrated, the motor drive 30 includes a processor 36 configured to execute instructions and to access or store operating data and/or configuration parameters stored in the corresponding memory device 38. The processor 36 may be any suitable processor according to the module requirements. It is contemplated that processor 36 may include a single processing device or multiple processing devices executing in parallel and may be implemented in separate electronic devices or incorporated on a single electronic device, such as a microprocessor, a field programmable gate array (FPGA) or application specific integrated circuit (ASIC). Similarly, the memory devices 38 may be a single device, multiple devices or may be incorporated in part or in whole within the FPGA or ASIC. The motor drive 30 also includes a network interface 34 to communicate with the industrial controller 10 and/or other devices via the industrial network. A feedback circuit 42 receives feedback signals from the motor 50 and from the devices mounted in, on, or proximate to the motor 50. According to the illustrated embodiment, a position sensor, such as an encoder 60, and a vibration sensor 62 are mounted to the motor 50 and provide feedback signals to the motor drive 30. The motor drive also includes a power section 40, where the power section 40 is configured to receive either AC or DC power from an external source and convert the external power to the variable frequency and variable amplitude voltage supplied to the motor. The variable frequency and variable amplitude voltage is provided to a stator 52 of the motor 50 which causes the rotor 54 and, in turn, the drive shaft 56 of the motor to rotate, thereby controlling operation of a machine, gearbox, or the like that is mechanically coupled to the drive shaft 56.

In operation, the motor drive 30 utilizes the feedback signals and, in particular, the position feedback signal to generate control signals for the power section 40 to generate the voltage at a necessary current level to regulate operation of the motor 50 according to a desired motor reference signal. The motor reference signal may be, for example, a desired position or position profile, a desired speed of rotation, or a desired torque output by the motor. A control module executing on the processor 36 receives the reference signal and utilizes voltage, current, position, and/or vibration feedback signals to achieve the desired operation.

However, as previously indicated, operating conditions within the controlled system may result in undesired operation. For example, bearing wear or misalignment in the mechanical coupling between the drive shaft 56 and the load may cause vibration in the motor 50. Other sources of vibration in the motor 50 include, but are not limited to, unbalanced weight or eccentricity on the drive shaft, a bent drive shaft, rotating or stationary looseness in the mechanical couplings, a drive belt fault, or a gearbox fault.

In order to avoid the undesired operation, it is desirable to identify which of the conditions is causing vibration in the motor. The different sources of vibration generate vibrations at different orders of the fundamental frequency of operation of the motor. Consequently, determining the order spectrum of a measured vibration signal may help identify a particular source of the vibration.

Traditional methods for obtaining the order spectrum require significant computational overhead and many are not suited for real-time processing. The traditional methods include, for example, conducting a Fourier analysis on the sampled vibration signal to obtain a frequency spectrum of the harmonic components present in the vibration signal. However, the sampled vibration signal is in the time domain as the signal is sampled at a fixed time interval. The order spectrum identifies harmonic content in a position domain. In order to obtain data in the position domain, the vibration signal either needs to be sampled at a fixed angular position rather than at a fixed time interval or the sampled data in the time domain needs to be transformed to data in the position domain. If a motor is operating at a fixed speed, then it is possible for the sampling frequency to be set to obtain data at a fixed angular position. However, the sampling frequency must vary as a function of the fixed speed, and if the motor is changing speed (i.e., accelerating or decelerating), then it is not possible to sample data directly in the position domain. Alternately, the data sampled in the time domain may be transformed to the position domain using a resampling technique, such as computed order tracking (COT). After obtaining the data in the position domain, the Fourier analysis provides an order spectrum of the sampled signal. As may be observed, the traditional methods for obtaining an order spectrum of a sampled signal require (1) a data buffer of sufficient size to store sampled data for performing the Fourier analysis, (2) either require operation at a fixed speed or require performing an initial resampling technique to convert the data to the position domain, and (3) require performing the computationally intensive Fourier transform. The system and method discussed below provide for a new method of obtaining the order spectrum that may be used in real-time to identify sources of vibration.

Figure 3:
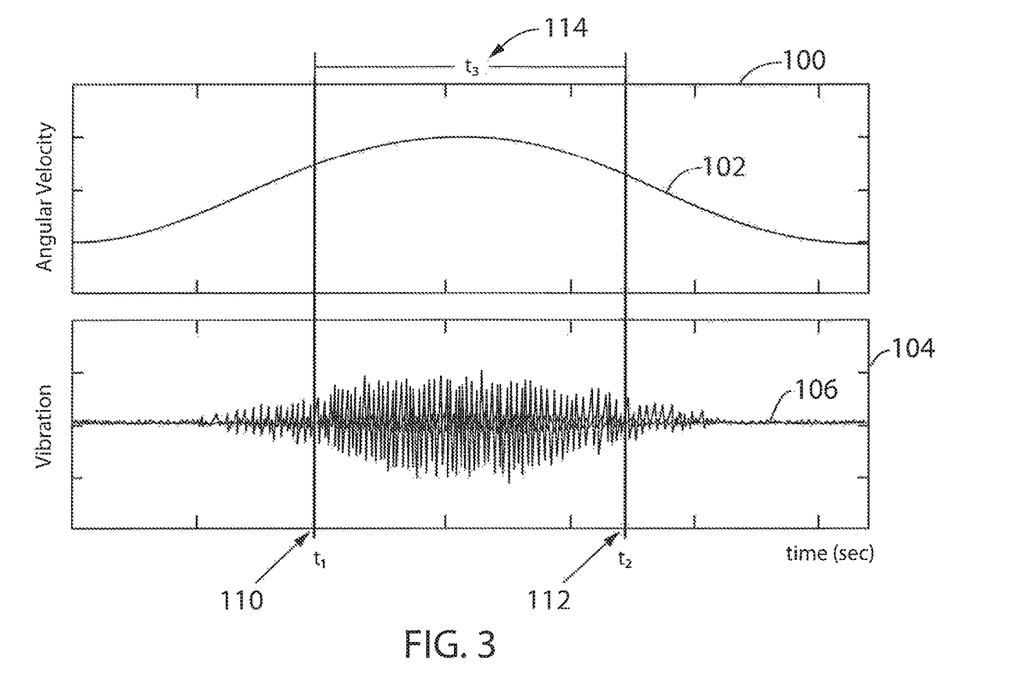
FIG. 3 is a graphical representation of an exemplary angular velocity feedback signal and an exemplary vibration feedback signal plotted with respect to time that may be utilized to monitor the operating condition of the motor of FIG. 1.
Figure 4:
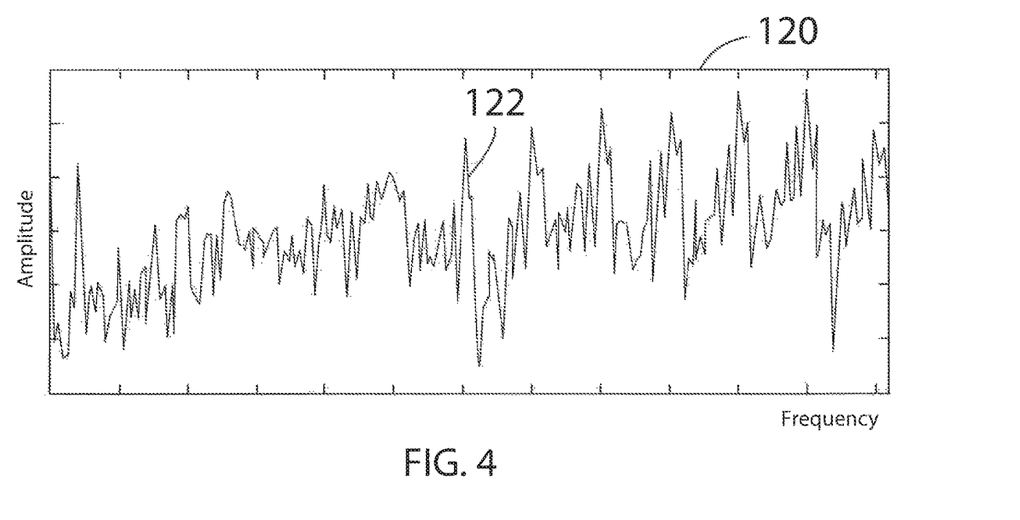
FIG. 4 is a graphical representation of a continuous order spectrum determined from an exemplary vibration signal and plotted with respect to frequency.

Turning next to FIG. 3, two exemplary feedback signals for use in obtaining the order spectrum are illustrated. The upper graph 100 includes a plot 102 of an angular velocity feedback signal, and the lower graph 104 includes a plot 106 of a vibration feedback signal. The angular velocity feedback signal may be provided directly from a feedback device mounted on the motor 50 or, optionally, the angular velocity may be determined by determining the derivative of an angular position feedback signal from an encoder 60 mounted on the motor 50. The angular velocity feedback signal may be generated by a vibration sensor 62 mounted on the motor 50.

An initial step for obtaining the order spectrum is identifying a portion of a motion profile that is of interest. With reference still to FIG. 3, the magnitude of vibration in the motor 50 increases during the middle portion of the motion profile 102 shown in the upper graph 100. A first time, $t_1$, 110 is identified as a start of the period of interest and a second time, $t_2$, 112 is identified as the end of the period of interest. The period of interest will be referred to herein as the sampling time, $t_3$, 114. According to one aspect of the invention, the sampling time, $t_3$, is selected during segments of operation where the magnitude of vibration is more pronounced. Preferably, the duration of the sampling time, $t_3$, includes multiple revolutions of the motor to capture multiple cycles of the vibration. The duration may include, for example, between three and ten revolutions of the motor. During the sampling time, $t_3$, 114, both the vibration signal 106 and the velocity feedback signal 102 are sampled at a predefined sampling frequency. Unlike traditional methods of obtaining the order spectrum, however, a large number of samples do not need to be stored and, therefore, a buffer is similarly not required. Rather, only the current sample of both the velocity feedback signal 102 and the vibration signal 106 as well as the prior two samples of the vibration signal 106 are required.

In order to obtain the order spectrum directly from the sampled data, a velocity synchronous analysis of the sampled signals is executed. It is contemplated the velocity synchronous analysis may be performed by the motor drive 30, the industrial controller 10, or the remote processing device 20. If the velocity synchronous analysis is performed by the industrial controller 10 or remote processing device 20, the motor drive 30 may transfer the sampled data to the corresponding device via the industrial network. For discussion herein, the velocity synchronous analysis will be discussed with respect to being performed on the motor drive 30. According to one aspect of the invention, a velocity synchronous Goertzel algorithm is executed by the processor 36 of the motor drive 30 as the motor drive controls operation of the motor. The velocity synchronous Goertzel algorithm as illustrated below in equations (1)-(3) provides for direct conversion of the time domain sampled signal to an order spectrum.

$$s[n]=x[n]v[n]+2\cos(\omega[n])s[n-1]-s[n-2] \quad (1)$$

where:
n is the sample instance;
x[n] is the value of the sampled signal at the sample instance;
v[n] is the value of the velocity signal at the sample instance; and
s[n] is an intermediate value at the sample instance.

$$\omega[n]=2\pi f \cdot v[n]/F_S \quad (2)$$

where:
ω[n] is the angular frequency corresponding to the desired fault order at the sample instance;
f is the fault order, and
$F_S$ is the sampling frequency.

$$y[n]=s[n]-e^{-j\omega[n]} \cdot s[n-1] \quad (3)$$

where: y[n] is the estimated magnitude of the order spectrum for the fault order, f, at the sample instance, n.

As illustrated above in equations (1)-(3), the magnitude of the order spectrum for a desired fault order may be determined directly from the sampled signals. The desired fault order, f, is selected and the above algorithm is executed in real time on the processor 36. The result of the algorithm is a magnitude of the order spectrum at the selected fault order.

Some fault conditions establish a vibration in the motor 50 at a characteristic frequency, where the characteristic frequency of the vibration is a multiple, or a known order, of the fundamental frequency. If a particular vibration is to be monitored, the motor drive may utilize the velocity synchronous Goertzel algorithm discussed above to obtain the magnitude of the order spectrum for the known fault order. In addition, certain fault conditions may include harmonic components at multiples of the fundamental frequencies. The motor drive may iteratively execute the velocity synchronous Goertzel algorithm discussed above for the fundamental frequency and for each harmonic frequency to obtain the magnitude of the order spectrum for each of the desired fault orders.

However, determining a magnitude of an order spectrum may include some fluctuations due, for example, to noise or disturbances observed in the monitored signal. In order to identify a fault condition in real time, it may be desirable to perform statistical change detection for the monitored fault order.

According to one aspect of the invention, the motor drive 30 may be configured to execute a statistical change detection module directly on the magnitudes of the fault orders obtained from the velocity synchronous Goertzel algorithm. Optionally, the magnitudes of the fault orders determined by the motor drive 30 may be transmitted to the industrial controller 10 or to the remote processing device 20 for execution of a statistical change detection module.

Figure 8:
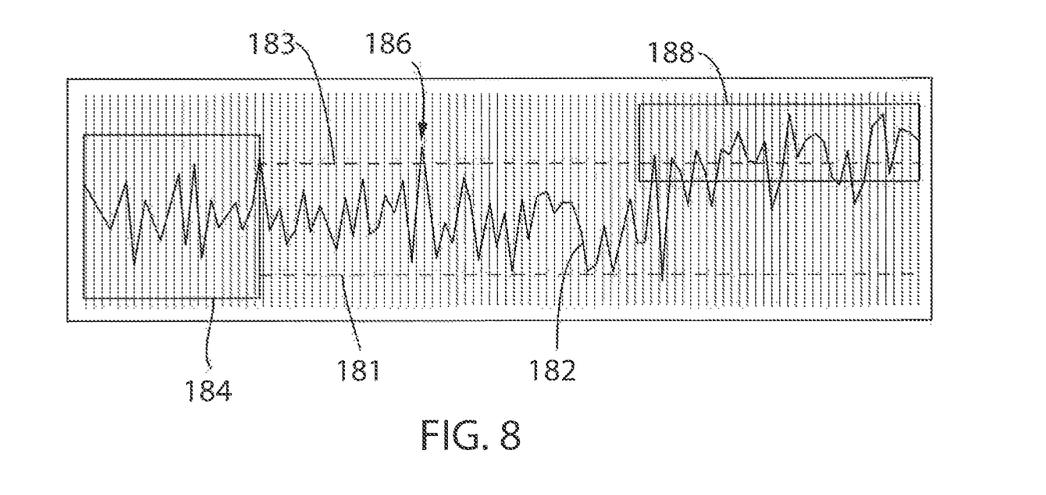
FIG. 8 is a plot illustrating a magnitude of an vibration at one order of the vibration under different operating conditions.

In either instance, an initial baseline operation of the motor 50 is observed under normal operating conditions. With reference, for example, to FIG. 8, the magnitude of an exemplary fault order 182 is plotted with respect to time. During an initial time window 184, the motor 50 is operated under normal operating conditions and the magnitude of the fault order is observed to establish a statistical baseline operation. Based on the observed statistical baseline operation, a lower threshold 181 and an upper threshold 183 may be set. During operation, an occasional value, such as the point identified by reference numeral 186, that lies outside the upper and lower thresholds may be a momentary disturbance and not indicative of a fault condition that would generate vibration in the motor 50. However, if the trend of the magnitude of the fault order indicates a continual operation outside of the upper and lower thresholds, as shown in the second time window 188, it is likely that the fault condition is present.

According to one aspect of the invention, the device monitoring the magnitude of the fault order for a statistical change (e.g., motor drive 30, industrial controller 10, or remote processing device 20) may execute an online change detection routine, such as a cumulative sum (CUSUM) routine or a general likelihood ratio test (GLRT) routine to track changes in time for the raw data of the exemplary fault order 182. The output of the change detection routine is a relatively smooth value that may be compared to the lower threshold 181 and the upper threshold 183. The change detection routine may detect both a long term trend and an abrupt change in the in the magnitude of the monitored fault order. When there is an abrupt change, the filtered output may be reset to quickly correspond to the new value of the raw data. The device monitoring the magnitude of the fault order may generate an alarm or a fault condition to alert an operator to either an abrupt change or a long-term change in the magnitude that exceeds the original upper and lower thresholds.

In addition to identifying a fault for a particular order, the velocity synchronous Goertzel algorithm may be executed repeatedly at a predefined number of different orders to obtain a limited order spectrum including harmonic content of the vibration signal. According to one embodiment of the invention, the velocity synchronous Goertzel algorithm may be executed for twelve orders, however, it is contemplated that various other numbers of orders may be utilized without deviating from the scope of the invention. The magnitudes of the order spectrum for each order may be included into a single vector, generating a fault vector for the measured signal.

Having obtained a fault vector, a particular source of the vibration may be identified. When the fault vector is plotted, each type of vibration exhibits a different characteristic plot. It is contemplated that the fault vector may be displayed, for example, on the display 26 of the remote processing device 20. If the velocity synchronous analysis is performed by the motor drive 30 or the industrial controller 10, the fault vector may be transmitted to the remote processing device 20 to be shown on the display 26. If the velocity synchronous analysis is performed by the remote processing device 20, the fault vector may be directly shown on the display 26. A technician may observe the plot to identify a particular type of vault according to the characteristics of the plot shown on the display 26.

According to another aspect of the invention, the type of fault may be determined automatically by the motor drive 30, the industrial controller 10, the remote processing device 20 or a combination thereof. As previously indicated, different types of faults exhibit different characteristic plots. For purposes of discussion, a bearing fault and automatic identification of the bearing fault will be examined. If the fault vector for a bearing fault is plotted on a spider graph, an ideal representation of the bearing fault would be a circle. An evaluation module executing on the motor drive 30, the industrial controller 10, the remote processing device 20 or a combination thereof determines how close a plot generated from the magnitudes of each order in the fault vector resemble a circle. Further, the evaluation module determines a magnitude of the fault corresponding to the measured vibration as well as a probability of the fault being a bearing fault. Although the bearing fault will be discussed herein, the discussion is intended to be exemplary for identification of a particular type of fault and is not intended to be limiting.

Figure 5:
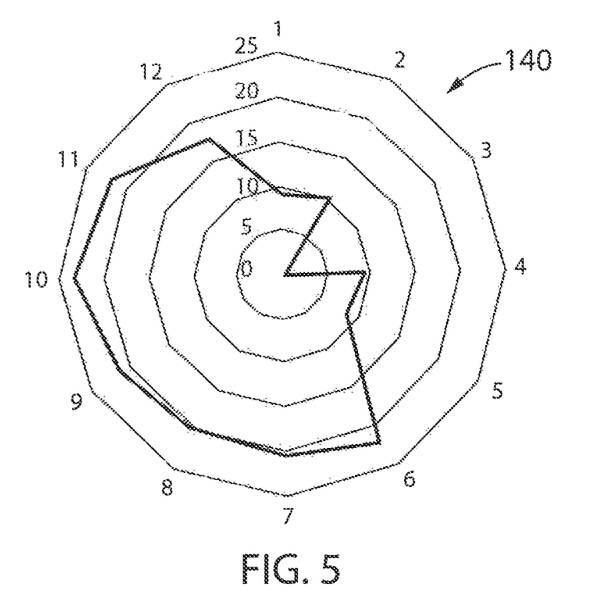
FIG. 5 is a graphical representation of a fault vector on a spider graph, where the fault vector includes the magnitudes of the harmonic content of the exemplary vibration signal at the first twelve orders.
Figure 6:
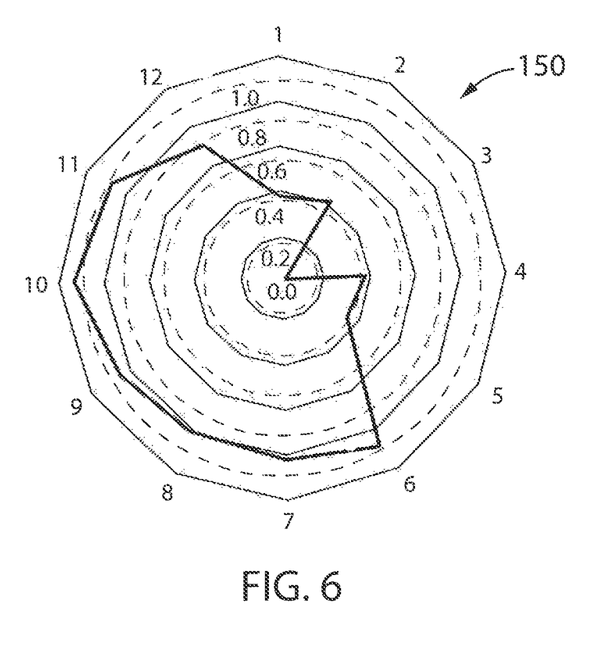
FIG. 6 is a graphical representation of the fault vector of FIG. 5, with the magnitudes of the harmonic content normalized to a unity scale.

Turning next to FIG. 5, an exemplary spider graph 140 with a fault vector plotted on the graph is illustrated, where the fault vector corresponds to an exemplary bearing fault. As illustrated, the plotted fault vector does not correspond directly to a circle. The evaluation module, therefore, needs to determine the magnitude of the fault detected by the fault vector and a probability that the fault vector corresponds to a bearing fault. Initially, the fault vector is normalized with respect to the maximum element in the vector. According to the illustrated embodiment, the tenth element has the largest magnitude. The magnitude of each element in the fault vector, therefore, may be divided by the magnitude of the tenth element. With reference also to FIG. 6, a normalized plot 150 of the fault vector is illustrated.

To evaluate how well the plotted fault vector corresponds to an ideal plot (e.g., a circle for the bearing fault), the evaluation module generates a feature vector as a function of the normalized fault vector. The feature vector includes multiple metrics that indicate how well the plotted fault vector corresponds to an ideal plot. The number and nature of metrics utilized may vary according to the type of fault being detected and according to the expected shape of the ideal plot.

For illustration, an exemplary feature vector for the bearing fault may include eight elements. The first and second metrics provide a measurement of how well the plot corresponds to an ideal circle. One of the metrics utilizes the origin of the spider graph as the center of a circle and the other of the metrics first identifies a center of the plotted fault vector as the center of the circle. Each metric is scored on a scale of zero to one, where the closer the metric is to one the more closely the plotted fault vector corresponds to an ideal circle and the closer the metric is to zero the further the plotted fault vector is from an ideal circle. The third, fourth, fifth, and sixth metrics provide an indication of the overall magnitude of the elements in the fault vector. Prior to setting the third, fourth, fifth, and sixth metrics, the magnitude of each element in the fault vector is sorted in ascending order. The third metric is the magnitude of the element at the first quartile, the fourth metric is the magnitude of the element at the second quartile, and the fifth metric is the magnitude of the element at the third quartile. The sixth metric is an interquartile mean of the first and third quartile. As the magnitudes of the third, fourth, fifth, and sixth metrics increase, the plotted fault vector more closely corresponds to an ideal circle. The seventh metric determines an average difference between elements in the fault vector. As the average difference between elements decreases, the fault vector more closely corresponds to an ideal circle. The eighth metric determines an average mean of all elements in the fault vector. As the average mean approaches one, the fault vector more closely corresponds to an ideal circle.

After generating a feature vector, the evaluation module uses the feature vector to determine the likelihood of a particular fault existing. A probability of a particular fault existing is determined using the magnitude of the metrics in the feature vector. Each metric is evaluated to determine whether the metric indicates the fault vector is more likely or less likely to indicate a fault is present. According to another aspect of the invention, coefficients for a logistic regression model corresponding to the fault condition are stored in memory. An exemplary logistic regression model for the bearing fault is given in equation (4).

$$Pr(Y=1) = \frac{1}{1 + e^{(\beta_0 + \beta_1 x_1 + \cdots + \beta_n x_n)}} \quad (4)$$

where: Y is the class;

$\beta_n$ are the coefficients; and $x_n$ are the magnitudes of each metric in the feature vector.

Figure 7:
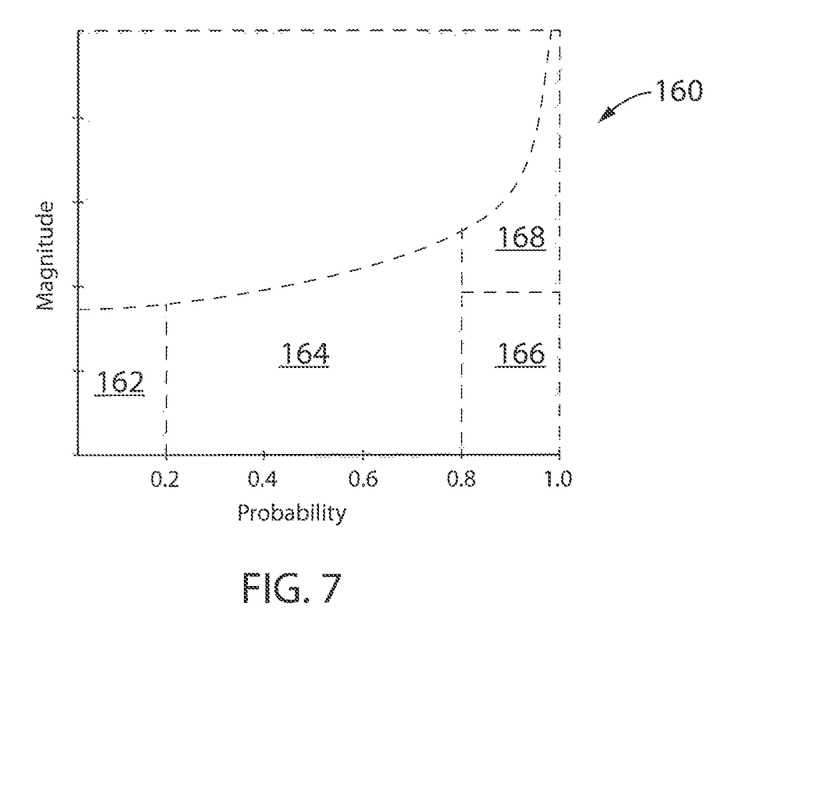
FIG. 7 is a probability chart illustrating a likelihood of a fault being present.

In addition to determining a probability of a particular fault being present, the evaluation module determines a magnitude of the measured fault. The magnitude of the fault is determined by finding the average magnitude of each order in the fault vector. Turning next to FIG. 7, the evaluation module utilizes the magnitude and probability of a particular fault, as determined above, to provide an indication of whether a fault is present. The chart of FIG. 7 is divided into four sections. The first section 162 indicates that the motor 50 is operating normally. The second section 164 indicates that a fault is suspected of being present. The third section 166 indicates that a fault having a small magnitude is present, and the fourth section 168 indicates that a fault having a large magnitude is present. The probability and magnitude determined from each fault vector and the corresponding feature vector are used to plot a point on the chart in FIG. 7. Based on which of the four sections the point falls, the evaluation module determines whether a fault is present and the severity of the fault. A message and/or alarm may be generated in the industrial controller to alert an operator of the fault condition.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A method for monitoring an operating condition of a motor with a motor drive operatively connected to control operation of the motor, the method comprising the steps of:
   periodically sampling a first feedback signal in a time domain at a sampling frequency, wherein the first feedback signal includes data corresponding to the operating condition of the motor;
   periodically sampling a velocity feedback signal with the first feedback signal in the time domain at the sampling frequency, wherein the velocity feedback signal corresponds to an angular velocity of the motor;
   generating a fault vector in a position domain for the first feedback signal as a function of the first feedback signal and of the velocity feedback signal, wherein the fault vector includes a magnitude of harmonic content present in the first feedback signal at each of a plurality of multiples of the angular velocity of the motor;
   generating a feature vector from the fault vector, wherein the feature vector includes a plurality of values identifying a difference between the magnitude of harmonic content in the fault vector and a magnitude of harmonic content in an ideal fault vector; and
   identifying a fault condition present in the motor as a function of the feature vector.

2. The method of claim 1 wherein the step of generating the fault vector further comprises the steps of:
   determining the magnitude of harmonic content present in the first feedback signal for a first multiple of the angular velocity of the motor in real-time as each of the first feedback signal and the velocity feedback signals are sampled; and
   repeating the above step for each of the plurality of multiples of the angular velocity present in the fault vector.

3. The method of claim 1 wherein the step of identifying the fault condition includes the steps of:
   plotting the fault vector on a graph; and
   comparing the plotted fault vector to plot of the ideal fault vector.

4. The method of claim 1 wherein the step of identifying the fault condition further comprises the steps of:
   determining a magnitude of the fault condition as a function of the fault vector; and
   determining a probability of the fault condition being present as a function of the feature vector.

5. The method of claim 4 wherein the probability of the fault condition is determined using a logistic regression model of the fault condition.

6. The method of claim 4 wherein the probability and the magnitude of the fault condition are compared to a plurality of predefined ranges of probabilities and magnitudes to determine whether the fault condition is present.b;normal 7. The method of claim 1 further comprising the step of:
   monitoring the fault vector for changes in the magnitude of harmonic content present in the first feedback signal over time, wherein the step of identifying the fault condition includes:
   comparing the magnitude of the monitored harmonic content to an upper and a lower threshold, and
   identifying the fault condition when the magnitude is outside of a range defined by the upper and lower threshold.

8. The method of claim 1 wherein the first feedback signal corresponds to a vibration measured in the motor.

9. The method of claim 8 wherein the first feedback signal is generated from one of a current reference, a current feedback, a torque reference, a torque feedback, and an estimated torque signal generated in the motor drive.

10. A system for monitoring an operating condition of a motor, the system comprising:
    a position sensor operatively connected to the motor, wherein the position sensor generates a position feedback signal corresponding to an angular position of the motor;
    a motor, drive operatively connected to the motor to control operation of the motor, the motor drive including:
    a feedback circuit operatively connected to the position sensor to receive the position feedback signal;
    a processor operative to:
       periodically sample the position feedback signal in a time domain,
       generate a velocity feedback signal corresponding to an angular velocity of the motor as a function of the position feedback signal,
       periodically sample a monitored feedback signal with the position feedback signal in the time domain, wherein the monitored feedback signal includes data corresponding to the operating condition of the motor,
       generate a fault vector in a position domain for the monitored feedback signal as a function of the monitored feedback signal and of the velocity feedback signal, wherein the fault vector includes a magnitude of harmonic content present in the monitored feedback signal for at least one multiple of the angular velocity of the motor, and
       identify a fault condition present in the motor when the magnitude of the harmonic content in the fault vector exceeds either an upper or a lower threshold, wherein the processor is operative to perform each of the steps in real time while the motor drive is controlling operation of the motor.

11. The system of claim 10 further comprising a vibration sensor operatively mounted to the motor, wherein:
    the vibration sensor generates a vibration feedback signal corresponding to vibration of the motor,
    the feedback circuit is operatively connected to the vibration sensor to receive the vibration feedback signal, and
    the monitored feedback signal is the vibration feedback signal.

12. The system of claim 10 wherein the monitored feedback signal is selected from one of a current reference, a current feedback, a torque reference, a torque feedback, and an estimated torque signal generated in the motor drive.

13. The system of claim 10 wherein the fault vector includes a magnitude of harmonic content present in the monitored feedback signal for a plurality of multiples of the angular velocity of the motor.

14. The system of claim 13 wherein the processor is further operative to:
   generate a feature vector from the fault vector, wherein the feature vector includes a plurality of values identifying a difference between the magnitude of harmonic content in the fault vector and a magnitude of harmonic content in an ideal fault vector,
   determine a magnitude of the fault condition as a function of the fault vector, and
   determine a probability of the fault condition being present as a function of the feature vector.

15. The system of claim 10 wherein the processor is further operative to monitor the fault vector for changes in the magnitude of harmonic content present in the monitored feedback signal over time, and wherein the step of identifying the fault condition includes comparing the magnitude of the harmonic content to an upper and a lower threshold, and identifying the fault condition when the magnitude is outside of a range defined by the upper and lower threshold.

16. A method for monitoring an operating condition of a motor with a motor drive operatively connected to control operation of the motor, the method comprising the steps of:
   periodically sampling a first feedback signal in a time domain at a sampling frequency, wherein the first feedback signal includes data corresponding to the operating condition of the motor;
   periodically sampling a velocity feedback signal with the first feedback signal in the time domain at the sampling frequency, wherein the velocity feedback signal corresponds to an angular velocity of the motor;
   generating a fault vector in a position domain for the first feedback signal as a function of the first feedback signal and of the velocity feedback signal, wherein the fault vector includes a magnitude of harmonic content present in the first feedback signal for at least one multiple of the angular velocity of the motor and wherein the fault vector is generated in real-time as the motor drive is controlling operation of the motor; and
   identifying, a fault condition present in the motor the magnitude of harmonic content in the fault vector exceeds either an upper or a lower threshold.

17. The method of claim 16 wherein the first feedback signal corresponds to a vibration measured in the motor.

18. The method of claim 16 wherein the first feedback signal is generated from one of a current reference, a current feedback, a torque reference, a torque feedback, and an estimated torque signal generated in the motor drive.

19. The method of claim 16 wherein the fault vector includes a magnitude of harmonic content present in the first feedback signal at each of a plurality of multiples of the angular velocity of the motor, the method further comprising the step of generating a feature vector from the fault vector, wherein the feature vector includes a plurality of values identifying a difference between the magnitude of harmonic content in the fault vector and a magnitude of harmonic content in an ideal fault vector and wherein the fault condition is identified as a function of the feature vector.

20. The method of claim 16 further comprising the step of:
   monitoring the fault vector for changes in the magnitude of harmonic content present in the first feedback signal over time, wherein the step of identifying the fault condition includes:
   comparing the magnitude of the monitored harmonic content to an upper and a lower threshold, and
   identifying the fault condition when the magnitude is outside of a range defined by the upper and lower threshold.

* * * * *